(12) United States Patent
Lee et al.

(10) Patent No.: US 9,484,409 B2
(45) Date of Patent: Nov. 1, 2016

(54) SEMICONDUCTOR DEVICES INCLUDING CHANNEL DOPANT LAYER

(71) Applicant: Samsung Electronics Co., Ltd., Gyeonggo-do (KR)

(72) Inventors: Eun-Sun Lee, Yongin-si (KR); Junhwa Song, Incheon (KR); Ji Hun Kim, Hwasung (KR); Jeonghoon Oh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/846,176

(22) Filed: Sep. 4, 2015

(65) Prior Publication Data

US 2016/0141367 A1 May 19, 2016

(30) Foreign Application Priority Data

Nov. 14, 2014 (KR) .......................... 10-2014-0158828

(51) Int. Cl.
| | |
|---|---|
| *H01L 29/76* | (2006.01) |
| *H01L 29/94* | (2006.01) |
| *H01L 29/10* | (2006.01) |
| *H01L 29/08* | (2006.01) |
| *H01L 29/04* | (2006.01) |
| *H01L 27/11* | (2006.01) |
| *G11C 7/06* | (2006.01) |
| *G11C 11/4091* | (2006.01) |
| *G11C 11/412* | (2006.01) |

(52) U.S. Cl.
CPC ........... *H01L 29/1033* (2013.01); *G11C 7/065* (2013.01); *G11C 11/4091* (2013.01); *G11C 11/412* (2013.01); *H01L 27/1116* (2013.01); *H01L 29/045* (2013.01); *H01L 29/0847* (2013.01); *H01L 29/1079* (2013.01)

(58) Field of Classification Search
CPC ........... H01L 29/0847; H01L 29/1033; H01L 27/1116
USPC .................................................. 257/368–369
See application file for complete search history.

(56) References Cited

U.S. PATENT DOCUMENTS

| | | | |
|---|---|---|---|
| 6,498,077 | B2 | 12/2002 | Ueno et al. |
| 6,881,987 | B2 | 4/2005 | Sohn |
| 6,995,397 | B2 | 2/2006 | Yamashita et al. |
| 7,179,696 | B2 | 2/2007 | Chakravarthi et al. |
| 8,389,350 | B2 | 3/2013 | Sakakidani et al. |
| 8,404,551 | B2 | 3/2013 | Ranade et al. |

(Continued)

FOREIGN PATENT DOCUMENTS

KR 10-2004-0103507 A 12/2004

*Primary Examiner* — Theresa T Doan
(74) *Attorney, Agent, or Firm* — Myers Bigel, P.A.

(57) ABSTRACT

A semiconductor device includes a semiconductor substrate including a well dopant layer having a first conductivity type, a gate electrode on the well dopant layer, a channel dopant layer in the well dopant layer and spaced apart from a top surface of the semiconductor substrate, a channel region between the gate electrode and the channel dopant layer, and source/drain regions in the well dopant layer at both sides of the gate electrode. The channel dopant layer and the channel region have the first conductivity type. The source/drain regions have a second conductivity type. A concentration of dopants having the first conductivity type in the channel dopant layer is higher than a concentration of dopants having the first conductivity type in the channel region. The semiconductor device may be used in a sense amplifier of a memory device.

20 Claims, 12 Drawing Sheets

(56) References Cited

U.S. PATENT DOCUMENTS

| | | |
|---|---|---|
| 8,530,286 B2 | 9/2013 | Shifren et al. |
| 8,598,007 B1 | 12/2013 | Flachowsky et al. |
| 8,748,277 B2 | 6/2014 | Chen et al. |
| 8,803,242 B2 | 8/2014 | Marino et al. |
| 2004/0262683 A1* | 12/2004 | Bohr ............... H01L 21/823814 257/338 |
| 2004/0262694 A1* | 12/2004 | Chidambaram ........................... H01L 21/823807 257/369 |
| 2013/0095630 A1 | 4/2013 | Eshun et al. |
| 2014/0084385 A1 | 3/2014 | Hoffmann et al. |
| 2014/0091397 A1 | 4/2014 | Ema et al. |
| 2014/0119099 A1 | 5/2014 | Clark et al. |

* cited by examiner

SEMICONDUCTOR DEVICES INCLUDING CHANNEL DOPANT LAYER

CROSS-REFERENCE TO RELATED APPLICATION

This U.S. non-provisional patent application claims priority under 35 U.S.C. §119 to Korean Patent Application No. 10-2014-0158828, filed on Nov. 14, 2014, in the Korean Intellectual Property Office, the disclosure of which is hereby incorporated by reference in its entirety.

BACKGROUND

The inventive concepts relate to semiconductor devices and methods for fabricating the same. More particularly, the inventive concepts relate to a semiconductor device including a metal-oxide-semiconductor (MOS) transistor that can provide improved electrical characteristics and methods for fabricating the same.

Semiconductor devices may include an integrated circuit including MOS field effect transistors. As semiconductor devices have become highly integrated, MOS field effect transistors have been scaled down, which may deteriorate an operating characteristic of the semiconductor devices.

SUMMARY

Embodiments of the inventive concepts may provide a semiconductor device capable of improving an integration density and electrical characteristics.

Embodiments of the inventive concepts may also provide a method for fabricating a semiconductor device capable of improving an integration density and electrical characteristics.

In one aspect, a semiconductor device may include: a semiconductor substrate including a well dopant layer having a first conductivity type; a gate electrode on the well dopant layer; a channel dopant layer in the well dopant layer and spaced apart from a top surface of the semiconductor substrate, the channel dopant layer having the first conductivity type; a channel region between the gate electrode and the channel dopant layer, the channel region having the first conductivity type; and source/drain regions in the well dopant layer at both sides of the gate electrode, the source/drain regions having a second conductivity type that is different from the first conductivity type. A concentration of dopants having the first conductivity type in the channel dopant layer may be higher than a concentration of dopants having the first conductivity type in the channel region. Each of the source/drain regions may include: an upper portion adjacent to the channel region; and a lower portion adjacent to the channel dopant layer. A dopant concentration of the upper portion may be substantially equal to a dopant concentration of the lower portion.

In an embodiment, the semiconductor device may further include: a gate spacer on both sidewalls of the gate electrode and extending on the source/drain regions.

In an embodiment, a thickness of the channel dopant layer may be greater than a thickness of the channel region.

In an embodiment, the channel region and the channel dopant layer have the same crystal structure.

In an embodiment, a distance from the top surface of the semiconductor substrate to the channel dopant layer may be smaller than a width of the gate electrode.

In an embodiment, a distance from the top surface of the semiconductor substrate to the channel dopant layer may be in a range of about 50 nm to about 80 nm.

In an embodiment, the concentration of the dopants having the first conductivity type in the channel dopant layer may be in a range of about $1 \times 10^{17}$ atom/cm$^3$ to about $1 \times 10^{18}$ atom/cm$^3$.

In an embodiment, the concentration of the dopants having the first conductivity type in the channel region may be in a range of about $1 \times 10^{16}$ atom/cm$^3$ to about $1 \times 10^{17}$ atom/cm$^3$.

In an embodiment, the semiconductor device may further include: a dopant diffusion barrier layer between the channel dopant layer and the channel region. The dopant diffusion barrier layer may include carbon (C), and a crystal structure of the dopant diffusion barrier layer may be different from a crystal structure of the channel dopant layer.

In another aspect, a semiconductor device may include: a plurality of memory cells, a respective one of which is connected to a respective crossing point of word lines and bit lines crossing the word lines; and a sense amplifier connected to at least one of the bit lines to sense data stored in the memory cells. The sense amplifier may include a pair of MOS transistors. The pair of MOS transistors may include: a well dopant layer in a semiconductor substrate and having a first conductivity type; gate electrodes spaced apart from each other on the well dopant layer; source/drain regions in the well dopant layer at both sides of each of the gate electrodes, the source/drain regions having a second conductivity type that is different from the first conductivity type; a channel dopant layer under each of the gate electrodes, the channel dopant layer having the first conductivity type; and a channel region between the channel dopant layer and each of the gate electrodes, the channel region having the first conductivity type. A concentration of dopants having the first conductivity type in the channel dopant layer may be higher than a concentration of dopants having the first conductivity type in the channel region.

In an embodiment, the semiconductor device may further include: a dopant diffusion barrier layer between the channel dopant layer and the channel region. The dopant diffusion barrier layer may include carbon (C).

In an embodiment, the semiconductor device may further include: a gate spacer on both sidewalls of each of the gate electrodes and extending on the source/drain regions.

In an embodiment, each of the source/drain regions may include: an upper portion adjacent to the channel region; and a lower portion adjacent to the channel dopant layer. A dopant concentration of the upper portion may be substantially equal to a dopant concentration of the lower portion.

In an embodiment, a distance from a top surface of the semiconductor substrate to the channel dopant layer may be smaller than a width of each of the gate electrodes.

In an embodiment, a thickness of the channel dopant layer may be greater than a thickness of the channel region.

In yet another aspect, a semiconductor device includes a substrate; a gate electrode on a face of the substrate; and a buried region having a first conductivity type in the substrate, beneath and spaced apart from the gate electrode, the buried region having a higher dopant concentration of the first conductivity type than the substrate between the buried region and the gate electrode and than the substrate beneath the buried region remote from the gate electrode. A source/drain region having a second conductivity type is also included in the substrate, that provides a P-N junction with the buried region, with the substrate between the buried region and the gate electrode and with the substrate beneath the buried region remote from the gate electrode, the source/drain region having substantially the same concentration of dopants of the second conductivity type at the P-N junction and remote from the p-n junction.

In an embodiment, the buried region is thicker than the substrate between the buried region and the gate electrode.

In an embodiment, a gate electrode is wider than a thickness of the substrate between the buried region and the gate electrode.

In an embodiment, the semiconductor device further comprises a dopant diffusion barrier layer comprising carbon (C), between the buried region and the gate electrode.

In an embodiment, the semiconductor device further comprises a sense amplifier comprising a plurality of transistors, at least one of which comprises the gate electrode, the buried region and the source/drain region.

In still another aspect, a method for fabricating a semiconductor device may include: forming a well dopant layer having a first conductivity type in a semiconductor substrate; forming a channel dopant layer having the first conductivity type in the well dopant layer, the channel dopant layer spaced apart from a top surface of the semiconductor substrate; forming a gate electrode on the well dopant layer in which the channel dopant layer is formed; forming a source/drain region having a second conductivity type in the well dopant layer at both sides of the gate electrode; and forming a gate spacer on both sidewalls of the gate electrode and extending on the source/drain regions. Here, forming the channel dopant layer may include: defining a channel region between the channel dopant layer and the gate electrode. The channel region may have the first conductivity type, and a dopant concentration of the channel dopant layer may be higher than that of the channel region. Each of the source/drain region may include an upper portion adjacent to the channel region and a lower portion adjacent to the channel dopant layer. A dopant concentration of the upper portion may be substantially equal to that of the lower portion.

In an embodiment, before forming the channel dopant layer, the method may further include: performing a pre-amorphous implantation process to form a dopant diffusion barrier layer including carbon (C) and germanium (Ge). The dopant diffusion barrier layer may be formed between the channel dopant layer and the channel region.

In an embodiment, the concentration of dopants having the first conductivity type in the channel dopant layer may be in a range of about $1\times10^{17}$ atom/cm$^3$ to about $1\times10^{18}$ atom/cm$^3$.

In an embodiment, the channel dopant layer may be spaced apart from a surface of the semiconductor substrate by a distance of about 50 nm to about 80 nm.

In an embodiment, forming the source/drain regions may include: ion-implanting dopants of the second conductivity type into the well dopant layer such that the source/drain regions come in contact with the channel dopant layer and the channel region.

BRIEF DESCRIPTION OF THE DRAWINGS

The inventive concepts will become more apparent in view of the attached drawings and accompanying detailed description.

DETAILED DESCRIPTION

Figure 1:
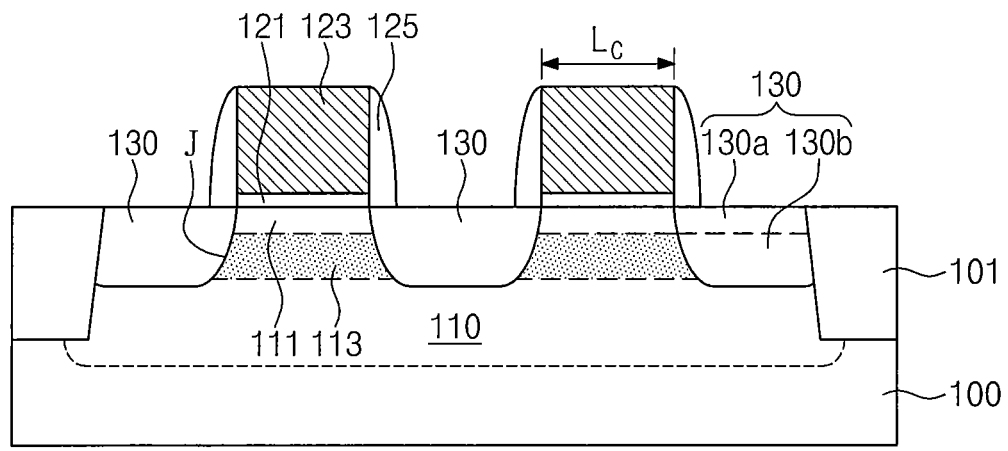
FIG. 1 is a cross-sectional view illustrating a semiconductor device according to an embodiment of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and may be exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes", "including", "have" and/or "having", and variants thereof, when used herein, specify the presence of stated features, steps, operations, elements, and/or components, but do not preclude the presence or addition of one or more other features, steps, operations, elements, components, and/or groups thereof.

Additionally, the embodiments in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the exemplary views, but may include other shapes that may be created according to manufacturing processes. Areas illustrated in the drawings have general properties, and are used to illustrate specific shapes of elements. Thus, this should not be construed as limiting to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Embodiments of aspects of the present inventive concepts explained and illustrated herein include their complementary counterparts. The same reference numerals or the same reference designators denote the same elements throughout the specification.

Spatially relative terms, such as "beneath," "below," "lower," "above," "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Moreover, various embodiments are described herein with reference to cross-sectional illustrations and/or plan illustrations that are idealized illustrations. Accordingly, variations from the shapes of the illustrations as a result, for example, of manufacturing techniques and/or tolerances, are to be expected. Thus, these embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
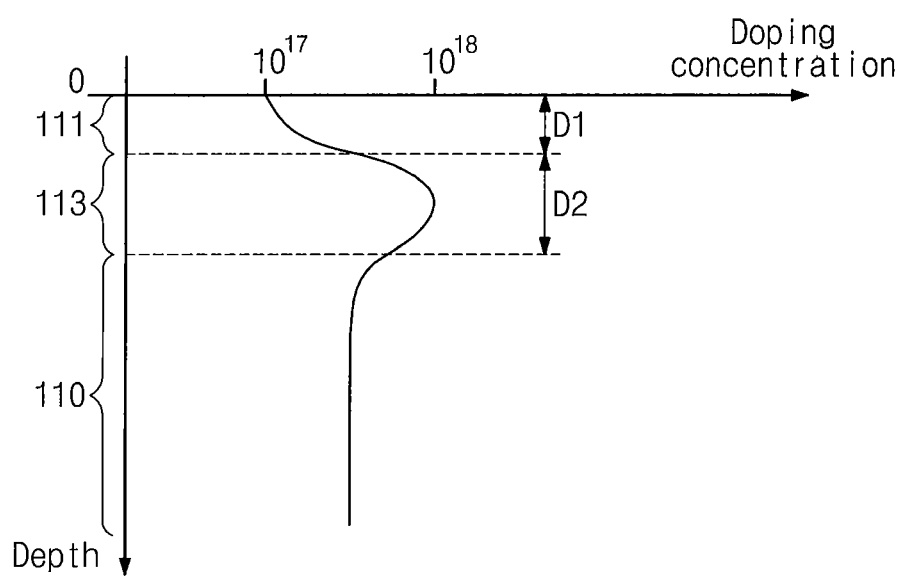
FIG. 2 is a graph illustrating a dopant concentration profile in a portion of a semiconductor device according to an embodiment of the inventive concepts.

FIG. 1 is a cross-sectional view illustrating a semiconductor device according to an embodiment of the inventive concepts. FIG. 2 is a graph illustrating a dopant concentration profile in a portion of a semiconductor device according to an embodiment of the inventive concepts.

Referring to FIGS. 1 and 2, a semiconductor device may include a semiconductor substrate 100, a gate electrode 123, source/drain regions 130 disposed at both sides of the gate electrode 123, a channel region 111 disposed under the gate electrode 123, and a channel dopant layer 113.

The semiconductor substrate 100 may be a bulk silicon substrate, a silicon-on-insulator (SOI) substrate, a germanium substrate, a germanium-on-insulator (GOI) substrate, a silicon-germanium substrate, a substrate including an epitaxial thin layer formed by performing a selective epitaxial growth (SEG) process and/or any other conventional microelectronic substrate.

A well dopant layer 110 may be formed in the semiconductor substrate 100 by performing an ion implantation process. The well dopant layer 110 may have a first conductivity type. In some embodiments, if the semiconductor device includes an N-type metal-oxide-semiconductor (NMOS) transistor, the well dopant layer 110 may be formed by implanting P-type dopant ions. For example, a concentration of the P-type dopants (e.g., boron (B)) in the well dopant layer 110 may be in a range of about $1 \times 10^{16}$ atom/cm$^3$ to about $1 \times 10^{18}$ atom/cm$^3$. Alternatively, if the semiconductor device includes a P-type MOS (PMOS) transistor, the well dopant layer 110 may be formed by implanting N-type dopant ions.

A device isolation layer 101 defining an active region may be formed in the well dopant layer 110. The device isolation layer 101 may include a high-density plasma (HDP) oxide layer, a boron-phosphor silicate glass (BPSG) layer, an undoped silicate glass (USG) layer and/or a spin-on-glass (SOG) layer. A top surface of the device isolation layer 101 may be disposed in the same plane as a top surface of the semiconductor substrate 100. Alternatively, the top surface of the device isolation layer 110 may protrude from, or be recessed below, the top surface of the semiconductor substrate 100.

The gate electrode 123 may be disposed on the semiconductor substrate 100 to intersect the active region. According to some embodiments, a pair of gate electrodes 123 may be disposed on the well dopant layer 110. A gate insulating pattern 121 may be disposed between the semiconductor substrate 100 and each of the gate electrodes 123.

The gate electrodes 123 may be formed of a conductive material. In some embodiments, each of the gate electrodes 123 may include a barrier metal layer and a metal layer. In some embodiments, the barrier metal layer may be formed of a conductive material having a predetermined work function. For example, the barrier metal layer may be formed of metal nitride layers such as a titanium nitride layer, a tantalum nitride layer, a tungsten nitride layer, a hafnium nitride layer, and/or a zirconium nitride layer. The metal layer may be formed of at least one conductive material having a specific resistance value lower than that of the barrier metal layer. For example, the metal layer may be formed of tungsten, copper, hafnium, zirconium, titanium, tantalum, aluminum, ruthenium, palladium, platinum, cobalt, nickel and/or conductive metal nitrides.

The gate insulating pattern 121 may include a high-k dielectric material of which a dielectric constant is higher than that of silicon oxide. For example, the gate insulating pattern 121 may include hafnium oxide, hafnium-silicon oxide, lanthanum oxide, lanthanum-aluminum oxide, zirconium oxide, zirconium-silicon oxide, tantalum oxide, titanium oxide, barium-strontium-titanium oxide, barium-titanium oxide, strontium-titanium oxide, yttrium oxide, aluminum oxide, lead-scandium-tantalum oxide and/or lead-zinc niobate. Alternatively, the gate insulating pattern 121 may be formed of a thermal oxide layer that is formed by thermally oxidizing the top surface of the semiconductor substrate 100.

According to some embodiments, the channel region 111 and the channel dopant layer 113 which have the first conductivity type may be disposed under each of the gate electrodes 123. The channel dopant layer 113 may be spaced apart from a bottom surface of the gate insulating pattern 121, and the channel region 111 may be adjacent to the gate insulating pattern 121. In other words, the channel region 111 may be disposed between the channel dopant layer 113 and the gate insulating pattern 121.

The channel dopant layer 113 may be formed by implanting dopant ions of the first conductivity type. A threshold voltage of the MOS transistor may be adjusted according to a concentration of the dopants of the channel dopant layer 113. In some embodiments, the concentration of the dopants having the first conductivity type in the channel dopant layer 113 may be higher than that of the dopants having the first conductivity type in the channel region 111, as illustrated in FIG. 2. In addition, the concentration of the dopants having the first conductivity type in the channel dopant layer 113 may be higher than that of the dopants having the first conductivity type in the well dopant layer 110. For example, the concentration of the dopants having the first conductivity type may be the maximum value in the channel dopant layer 113.

In some embodiments, if the semiconductor device includes the NMOS transistor, the channel dopant layer 113 and the channel region 111 may be formed by implanting P-type dopant ions into the active region. Here, the channel dopant layer 113 may have a first dopant concentration, and the channel region 111 may have a second dopant concentration lower than the first dopant concentration. For example, the concentration of the P-type dopants (e.g., boron (B)) in the channel dopant layer 113 may be in a range of about $1\times10^{17}$ atom/cm$^3$ to about $1\times10^{18}$ atom/cm$^3$. The concentration of the P-type dopants (e.g., boron (B)) in the channel region 111 may be in a range of about $1\times10^{16}$ atom/cm$^3$ to about $1\times10^{17}$ atom/cm$^3$. Alternatively, if the semiconductor device includes the PMOS transistor, the channel dopant layer 113 and the channel region 111 may be formed by implanting N-type dopant ions into the active region. For example, the concentration of the N-type dopants (e.g., phosphorus (P)) in the channel dopant layer 113 may be in a range of about $1\times10^{16}$ atom/cm$^3$ to about $1\times10^{17}$ atom/cm$^3$. The concentration of the N-type dopants (e.g., phosphorus (P)) in the channel region 111 may be in a range of about $1\times10^{15}$ atom/cm$^3$ to about $1\times10^{16}$ atom/cm$^3$.

According to some embodiments, a distance from the top surface of the semiconductor substrate 100 to the channel dopant layer 113 may be smaller than a width $L_C$ of the gate electrode 123 (i.e., a channel length of the MOS transistor). For example, the width $L_C$ of the gate electrode 123 may be in a range of about 50 nm to about 100 nm, and the channel dopant layer 113 may be spaced apart from the top surface of the semiconductor substrate 100 by a distance of about 50 nm to about 80 nm. In addition, a thickness D2 of the channel dopant layer 113 may be greater than a thickness D1 of the channel region 111. For example, the thickness D1 of the channel region 111 may be in a range of about 50 nm to about 80 nm. In some embodiments, the concentration of the dopants having the first conductivity type may have a maximum value at a depth of about 50 nm to about 80 nm from the top surface of the semiconductor substrate 100.

According to some embodiments of the inventive concepts, since the channel dopant layer 113 is spaced apart from the gate electrode 123 by a predetermined distance, it is possible to inhibit the dopants of the channel dopant layer 113 from being diffused toward the top surface of the semiconductor substrate 100. In addition, since the concentration of the dopants having the first conductivity type is lower in the channel region 111 adjacent to the gate electrode 123 than in the channel dopant layer 113, it is possible to reduce or minimize variation of the threshold voltage which may be caused by random dopant fluctuation occurring at the surface of the semiconductor substrate 100. Moreover, since the channel dopant layer 113 is heavily doped with the dopants of the first conductivity type, it is possible to reduce or prevent a channel length of the MOS transistor from being reduced by the diffusion of dopants of the source/drain regions 130 having a second conductivity type.

Furthermore, if the pair of gate electrodes 123 is formed on the semiconductor substrate 100 as illustrated in FIG. 1, it is possible to reduce a difference between threshold voltages of a pair of MOS transistors which may be caused by dopants randomly diffused under the gate electrodes 123. In other words, mismatch between the threshold voltages of the pair of MOS transistors may be prevented.

FIG. 1 may also be regarded as illustrating various embodiments of the inventive concepts wherein a buried region 113 having a first conductivity type is provided in the substrate 100, beneath and spaced apart from the gate electrode 123. The buried region 113 has higher dopant concentration of the first conductivity type than the substrate 100 between the buried region 113 and the gate electrode 123 (which may correspond to the channel region 111 in some embodiments) and than the substrate 100 beneath the buried region 113 remote from the gate electrode 123 (which may be correspond to the well dopant layer 110 in some embodiments).

Gate spacers 125 on, and in some embodiments covering, both sidewalls of the gate electrodes 123 may be disposed on the source/drain regions 130. The gate spacers 125 may be formed of an insulating material such as silicon oxide and/or silicon nitride.

The source/drain regions 130 may be disposed in the well dopant layer 110 at both sides of each of the gate electrodes 123 and may be disposed under the gate spacers 125. Dopant ions of the second conductivity type may be implanted using the gate electrodes 123 as ion implantation masks into the well dopant layer 110 to form the source/drain regions 130.

In some embodiments, the channel dopant layer 113 and the channel region 111 may be disposed between the source/drain regions 130 horizontally spaced apart from each other. The source/drain regions 130 may be in contact with the channel region 111 and the channel dopant layer 113. Each of the source/drain regions 130 may include an upper portion 130a being in contact with the channel region 111 and a lower portion 130b being in contact with the channel dopant layer 113. Here, the channel region 111 and the channel dopant layer 113 include the dopants of the first conductivity type, and the source/drain regions 130 include the dopants of the second conductivity type that is opposite the first conductivity type. A concentration of the dopants of the second conductivity type in the upper portion 130a may be substantially equal to a concentration of the dopants of the second conductivity type in the lower portion 130b. For example, the concentration of the dopants of the second conductivity type in the upper and lower portions 130a and 130b of the source/drain regions 130 may be in a range of about $1 \times 10^{20}$ atom/cm$^3$ to about $1 \times 10^{21}$ atom/cm$^3$. A dopant concentration difference at a boundary portion between the source/drain regions 130 and the channel dopant layer 113 may be smaller than a dopant concentration difference at a boundary portion between the source/drain regions 130 and the channel region 111.

As also illustrated in FIG. 1, in some embodiments, the source/drain region 130 in the substrate 110 provides a P-N junction J with the buried region 113, with the substrate 100 between the buried region 113 and the gate electrode 123 (which may correspond to the channel region 111 in some embodiments) and with the substrate 100 beneath the buried region 113 remote from the gate electrode 123 (which may correspond to the well dopant layer 110 in some embodiments). The source/drain region 130 has the same concentration of dopants of the second conductivity type at the P-N junction J and remote from the P-N junction J.

According to some embodiments, the channel length of the MOS transistor may be substantially equal to a distance between the source/drain regions 130. An overlapping area between the gate electrode 123 and the source/drain regions 130 can be reduced to secure a sufficient channel length of the MOS transistor.

Figure 3:
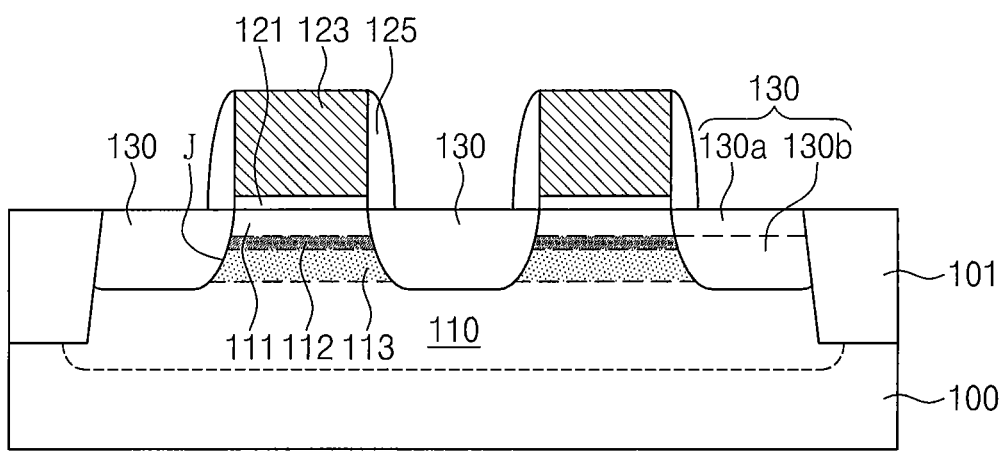
FIG. 3 is a cross-sectional view illustrating a semiconductor device according to an embodiment of the inventive concepts.

FIG. 3 is a cross-sectional view illustrating a semiconductor device according to an embodiment of the inventive concepts. In the present embodiment, the descriptions to the same elements as in the above embodiment will be omitted or mentioned briefly for the purpose of ease and convenience in explanation.

Referring to FIG. 3, a dopant diffusion barrier layer 112 including carbon (C) may be disposed between the channel dopant layer 113 and the channel region 111. Carbon atoms in the dopant diffusion barrier layer 112 may reduce or inhibit the dopants of the heavily doped channel dopant layer 113 from being diffused to the channel region 111. For example, a carbon concentration of the dopant diffusion barrier layer 112 may be in a range of about $1 \times 10^{14}$ atom/cm$^3$ to about $1 \times 10^{15}$ atom/cm$^3$. The carbon atoms may inhibit boron atoms of the channel dopant layer 113 disposed under the dopant diffusion barrier layer 112 from being diffused to the channel region 111. In addition, the dopant diffusion barrier layer 112 may further include germanium (Ge). The dopant diffusion barrier layer 112 including germanium (Ge) may be in an amorphous state. In other words, a crystal structure of the dopant diffusion barrier layer 112 may be different from those of the channel region 111 and the channel dopant layer 113. As a result, the crystal structure may be changed between the channel region 111 and the channel dopant layer 113, so it is possible to further inhibit the boron atoms of the channel dopant layer 113 from being diffused to the channel region 111.

Figure 4:
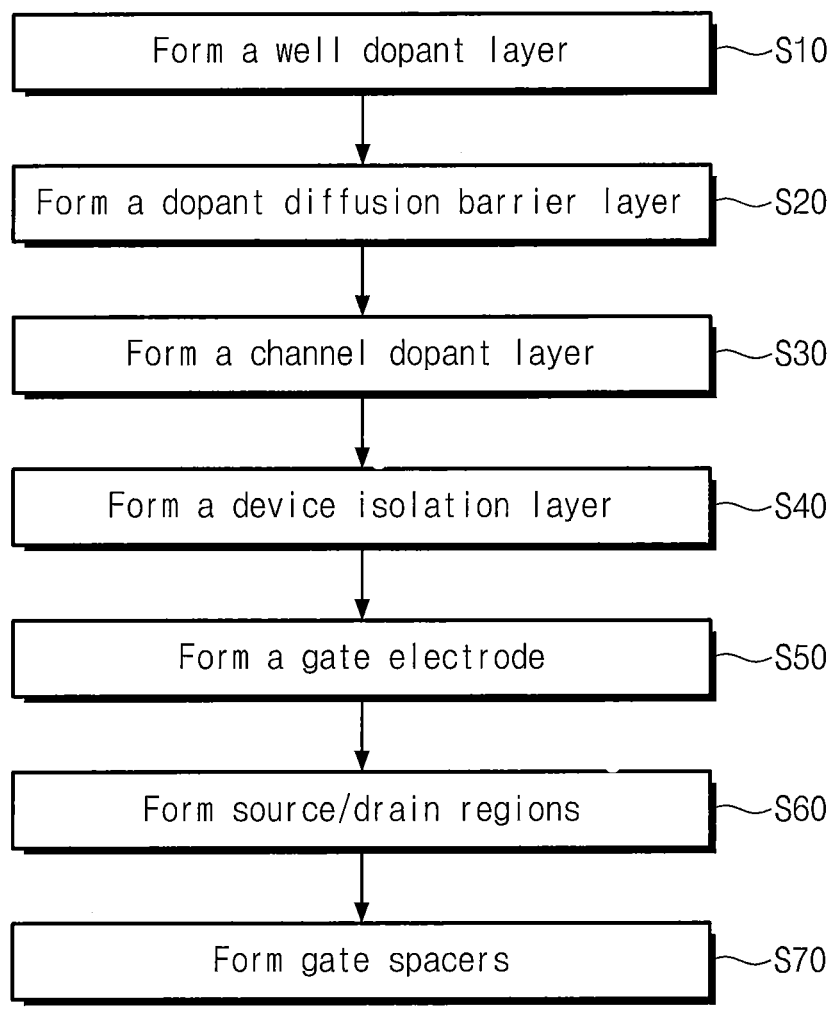
FIG. 4 is a flow chart illustrating a method for fabricating a semiconductor device according to an embodiment of the inventive concepts.

FIG. 4 is a flow chart illustrating a method for fabricating a semiconductor device according to an embodiment of the inventive concepts. FIGS. 5 to 10 are cross-sectional views illustrating a method for fabricating a semiconductor device according to an embodiment of the inventive concepts.

Figure 5:
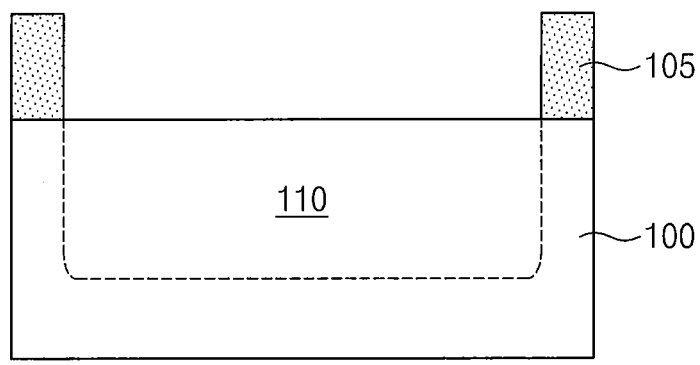
FIGS. 5 to 10 are cross-sectional views illustrating a method for fabricating a semiconductor device according to an embodiment of the inventive concepts.

Referring to FIGS. 4 and 5, a well dopant layer 110 having a first conductivity type may be formed in a semiconductor substrate 100 (block S10).

According to some embodiments, the semiconductor substrate 100 may be a single-crystalline silicon substrate. Alternatively, the semiconductor substrate 100 may be a silicon-on-insulator (SOI) substrate, a germanium substrate, a germanium-on-insulator (GOI) substrate, a silicon-germanium substrate, a substrate including an epitaxial thin layer formed by performing a selective epitaxial growth (SEG) process and/or any other conventional microelectronic substrate.

The well dopant layer 110 may be formed by doping a portion of the semiconductor substrate 100 with dopants of the first conductivity type. The dopants of the first conductivity type may be P-type dopants such as boron. Alternatively, the dopants of the first conductivity type may be N-type dopants such as phosphorus or arsenic.

In some embodiments, a mask pattern 105 may be formed on the semiconductor substrate 100 to expose a portion of the semiconductor substrate 100, and an ion implantation process may be performed using the mask pattern 105 as an ion implantation mask to form the well dopant layer 110. In some embodiments, the ion implantation process for forming the well dopant layer 110 may be performed with a first ion implantation energy (e.g., about 25 KeV to about 35 KeV), and a concentration of the dopants (e.g., boron) in the well dopant layer 110 may be in a range of about $1 \times 10^{16}$ atom/cm$^3$ to about $1 \times 10^{18}$ atom/cm$^3$.

Figure 6:
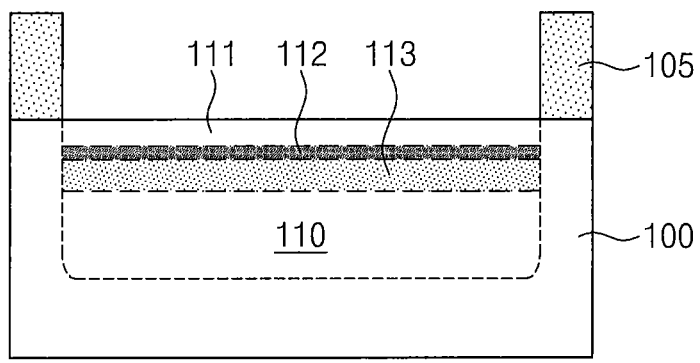

Referring to FIGS. 4 and 6, a dopant diffusion barrier layer 112 may be formed in the well dopant layer 110 having the first conductivity type (block S20).

According to some embodiments, impurities (e.g., carbon (C) or nitrogen (N)) may be ion-implanted using the mask pattern 105 as an ion implantation mask into the semiconductor substrate 100 to form the dopant diffusion barrier layer 112. The impurities such as the carbon (C) and the nitrogen (N) may reduce or inhibit dopants of a channel dopant layer 113 to be formed in a subsequent process from being activated and/or being diffused to the surface of the semiconductor substrate 100. In an embodiment, a concentration of the impurities such as the carbon (C) and the nitrogen (N) may be in a range of about $1 \times 10^{14}$ atom/cm$^3$ to about $1 \times 10^{15}$ atom/cm$^3$.

In addition, during the formation of the dopant diffusion barrier layer 112, the dopant diffusion barrier layer 112 may be doped with silicon and/or germanium impurities having the same lattice structure as the semiconductor substrate 100 as well as the impurities such as the carbon (C) and/or the nitrogen (N). In some embodiments, the dopant diffusion barrier layer 112 may include germanium atoms and carbon atoms. This dopant diffusion barrier layer 112 may be formed by performing a pre-amorphous implantation process, so the semiconductor substrate 100 of the dopant diffusion barrier layer 112 may be in an amorphous state. In other words, a crystal structure of the well dopant layer 110 may be different from a crystal structure of the dopant diffusion barrier layer 112. That is, lattice defects and lattice mismatch may locally occur in the dopant diffusion barrier layer 112. Thus, the dopant diffusion barrier layer 112 may inhibit boron atoms of the channel dopant layer 113 from being diffused.

Referring again to FIGS. 4 and 6, a channel dopant layer 113 having the first conductivity type may be formed in the well dopant layer 110 having the first conductivity type (block S30).

The channel dopant layer 113 may be doped with dopants of the same conductivity type (i.e., the first conductivity type) as the dopants of the well dopant layer 110. The dopants of the first conductivity type may be P-type dopants such as boron. Alternatively, the dopants of the first conductivity type may be N-type dopants such as phosphorus or arsenic.

In some embodiments, the channel dopant layer 113 may be formed by performing an ion implantation process using the mask pattern 105 as an ion implantation mask. The ion implantation process for forming the channel dopant layer 113 may be performed with a second ion implantation energy (e.g., about 20 KeV to about 30 KeV) less than the first ion implantation energy. A dopant concentration of the channel dopant layer 113 may be substantially equal to or higher than the dopant concentration of the well dopant layer 110. For example, the concentration of the dopants (e.g., boron) having the first conductivity type in the channel dopant layer 113 may be in a range of about $1\times10^{17}$ atom/cm$^3$ to about $1\times10^{18}$ atom/cm$^3$.

The channel dopant layer 113 heavily doped with the dopants may be spaced apart from the surface of the semiconductor substrate 100. The ion implantation process for forming the channel dopant layer 113 may be controlled such that the channel dopant layer 113 may have the maximum dopant concentration under the dopant diffusion barrier layer 112 to prevent the diffusion of the dopants. In some embodiments, a thickness of the channel dopant layer 113 may be greater than a distance between the channel dopant layer 113 and the top surface of the semiconductor substrate 100. The distance between the channel dopant layer 113 and the top surface of the semiconductor substrate 100 may be in a range of about 50 nm to about 80 nm. The concentration of the dopants having the first conductivity type may have the maximum value at a depth of about 50 nm to about 80 nm from the surface of the semiconductor substrate 100. Since the channel dopant layer 113 is formed as described above, a channel region 111 may be defined between the surface of the semiconductor substrate 100 and the channel dopant layer 113. A dopant concentration of the channel region 111 may be lower than that of the channel dopant layer 113. For example, the concentration of the dopants (e.g., boron) having the first conductivity type in the channel region 111 may be in a range of about $1\times10^{16}$ atom/cm$^3$ to about $1\times10^{17}$ atom/cm$^3$.

The mask pattern 105 disposed on the semiconductor substrate 100 may be removed after the formation of the channel dopant layer 113.

Figure 7:
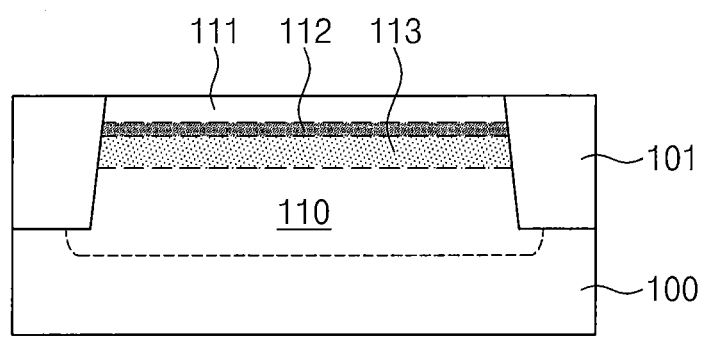

Referring to FIGS. 4 and 7, a device isolation layer 101 defining an active region may be formed in the well dopant layer 110 (block S40).

In some embodiments, a trench may be formed in the semiconductor substrate 100 to define the active region, and the trench may be then filled with an insulating material to form the device isolation layer 101. In an embodiment, the device isolation layer 101 may include an oxide liner, a nitride liner, and/or a filling insulation layer. As described above, the device isolation layer 101 may be formed after the formation of the well dopant layer 110 and the channel dopant layer 113. Alternatively, the device isolation layer 101 may be formed before the formation of the well dopant layer 110 and the channel dopant layer 113.

Figure 8:
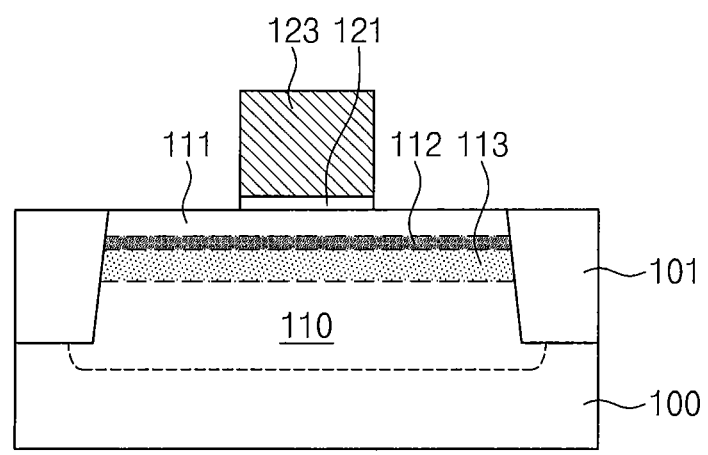

Referring to FIGS. 4 and 8, a gate insulating pattern 121 and a gate electrode 123 may be formed on the well dopant layer 110 in which the active region is defined (block S50).

A gate insulating layer and a gate conductive layer may be sequentially formed on the semiconductor substrate 100, and a patterning process may be performed on the gate conductive layer and the gate insulating layer to form the gate insulating pattern 121 and the gate electrode 123.

The gate insulating pattern 121 may include a high-k dielectric material of which a dielectric constant is higher than that of silicon oxide. For example, the gate insulating pattern 121 may include hafnium oxide, hafnium-silicon oxide, lanthanum oxide, lanthanum-aluminum oxide, zirconium oxide, zirconium-silicon oxide, tantalum oxide, titanium oxide, barium-strontium-titanium oxide, barium-titanium oxide, strontium-titanium oxide, yttrium oxide, aluminum oxide, lead-scandium-tantalum oxide and/or lead-zinc niobate.

The gate electrode 123 may include a metal nitride layer (e.g., titanium nitride, tantalum nitride, tungsten nitride, hafnium nitride, and/or zirconium nitride) and/or a metal layer (e.g., tungsten, copper, hafnium, zirconium, titanium, tantalum, aluminum, ruthenium, palladium, platinum, cobalt, and/or nickel).

Figure 9:
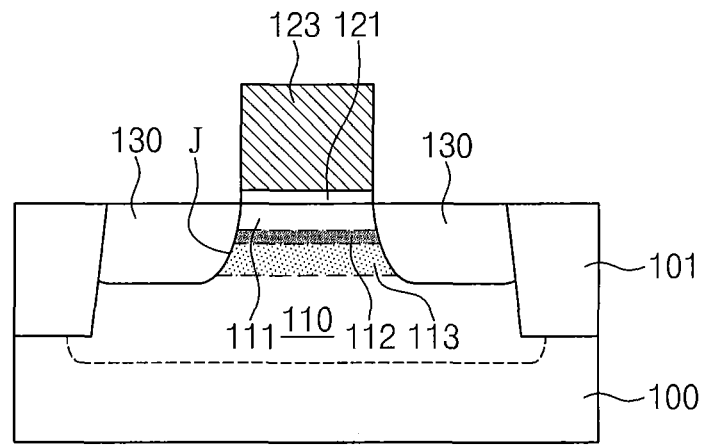

Referring to FIGS. 4 and 9, source/drain regions 130 may be formed in the well dopant layer 110 at both sides of the gate electrode 123 (block S60).

The source/drain regions 130 may be formed by performing an ion implantation process using the gate electrode 123 as an ion implantation mask. The source/drain regions 130 may include dopant of a second conductivity type. A concentration of the dopants having the second conductivity type in the source/drain regions 130 may be in a range of about $1\times10^{20}$ atom/cm$^3$ to about $1\times10^{21}$ atom/cm$^3$.

The ion implantation process for forming the source/drain regions 130 may be performed with a third ion implantation energy (e.g., about 30 KeV to about 35 KeV) which is substantially equal to or higher than the second ion implantation energy. Thus, the source/drain regions 130 may be in contact with the channel region 111 and the channel dopant layer 113. The source/drain region 130 may include an upper portion adjacent to the channel region 111 and a lower portion adjacent to the channel dopant layer 113. A concentration of the dopants of the second conductivity type in the upper portion of the source/drain region 130 may be substantially equal to a concentration of the dopants of the second conductivity type in the lower portion of the source/drain region 130.

Figure 10:
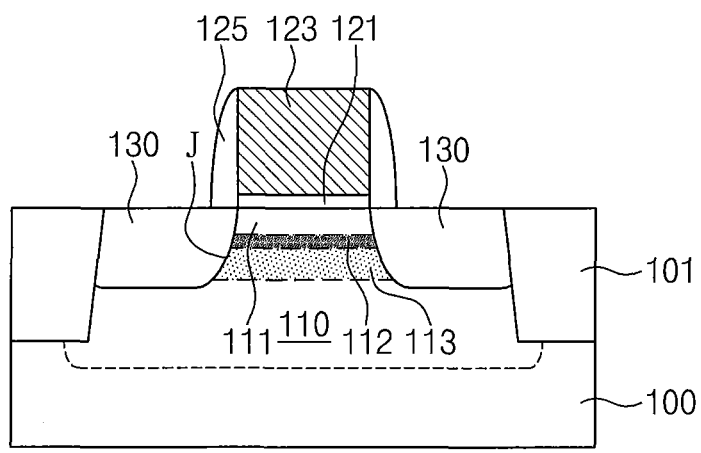

Referring to FIGS. 4 and 10, gate spacers 125 covering both sidewalls of the gate electrode 123 may be formed on the source/drain regions 130 (block S70).

A gate spacer layer with a substantially uniform thickness may be formed on the semiconductor substrate 100 having the gate electrode 123, and a blanket anisotropic etching process (e.g., an etch-back process) may be performed on the gate spacer layer to form the gate spacers 125. The gate spacers 125 may be formed of an insulating material such as silicon oxide, silicon oxynitride, and/or silicon nitride.

According to some embodiments, since the source/drain regions 130 are formed before the formation of the gate spacers 125, the source/drain regions 130 with a high concentration may be disposed under the gate spacers 125.

Figure 11:
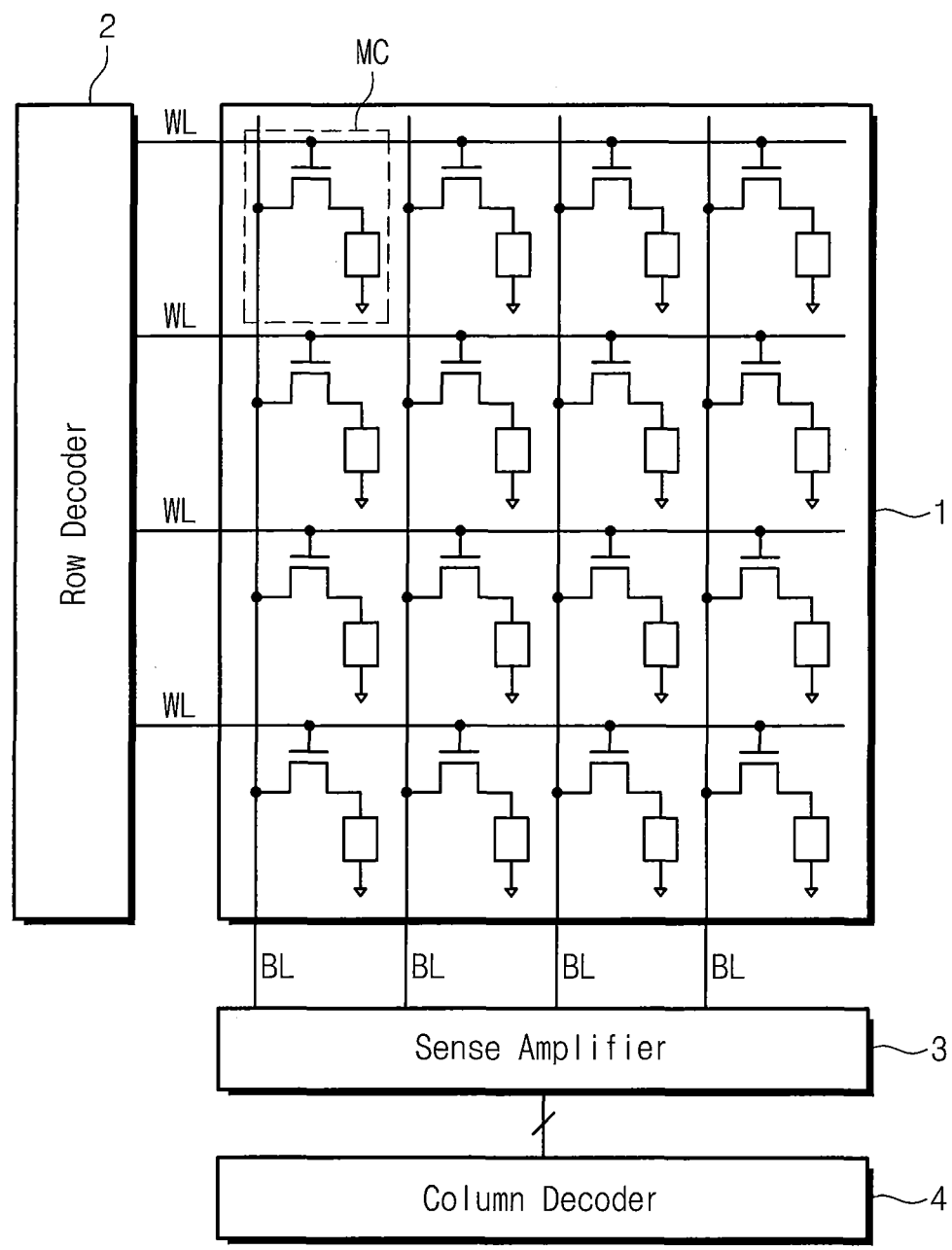
FIG. 11 is a schematic block diagram illustrating a semiconductor memory device according to an embodiment of the inventive concepts.
Figure 12:
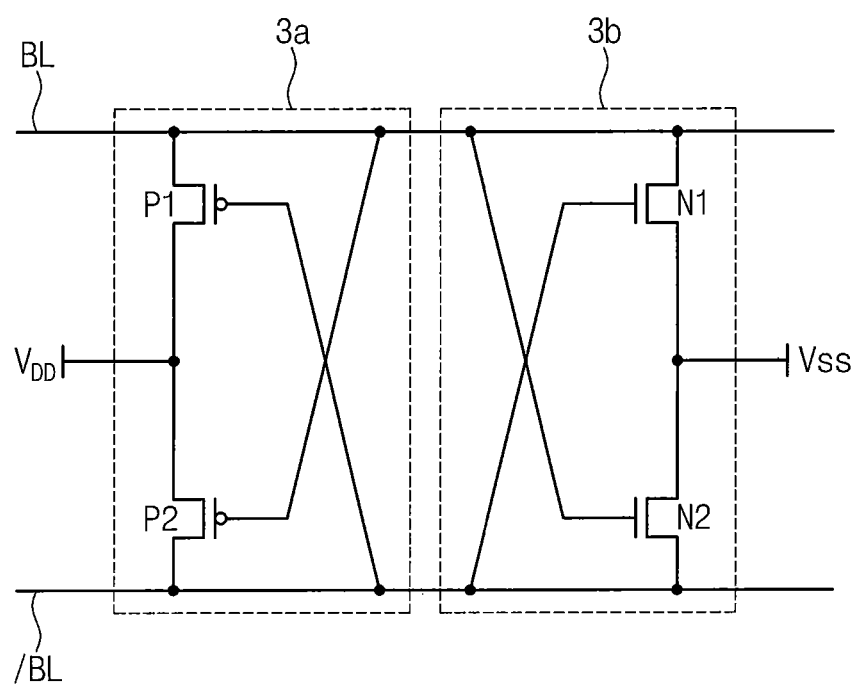
FIG. 12 is a circuit diagram illustrating a sense amplifier of a semiconductor memory device according to an embodiment of the inventive concepts.

FIG. 11 is a schematic block diagram illustrating a semiconductor memory device according to an embodiment of the inventive concepts. FIG. 12 is a circuit diagram illustrating a sense amplifier of a semiconductor memory device according to an embodiment of the inventive concepts.

Referring to FIG. 11, a semiconductor memory device may include a memory cell array 1, a row decoder 2, a sense amplifier 3, a column decoder 4, and control circuits.

The memory cell array 1 may include a plurality of memory cells MC two-dimensionally or three-dimensionally arranged. Each of the memory cells MC may be connected between a word line WL and a bit line BL crossing each other. In other words, the memory cells MC may be respectively connected to crossing points of the word lines WL and the bit lines BL. Each of the memory cells MC may include a data storage element and a selection element which may be electrically connected in series to each other. The data storage element may be connected between the bit line BL and the selection element, and the selection element may be connected between the data storage element and the word line WL. The selection element may be a field effect transistor, and the data storage element may be realized as a capacitor or a variable resistor.

The row decoder 2 may decode an address signal inputted from an external system to select one of the word lines WL of the memory cell array 1. The address signal decoded in the row decoder 2 may be provided to a row driver (not shown), and the row driver may provide predetermined voltages to the selected word line WL and unselected word lines WL in response to control signals of the control circuits. The voltage provided to the selected word line WL may be different from the voltage provided to the unselected word lines WL.

The sense amplifier 3 may sense and amplify a voltage difference between a reference bit line and a bit line BL selected by an address signal decoded in the column decoder 4.

The column decoder 4 may provide a data transmission path between the sense amplifier 3 and an external device (e.g., a memory controller). The column decoder 4 may decode an address signal inputted from the external system to select one of the bit lines BL.

Referring to FIG. 12, the sense amplifier 3 may include a first driving part 3a and a second driving part 3b that are connected between a pair of bit lines BL and /BL. The first driving part 3a may include PMOS transistors P1 and P2 connected in series between the pair of bit lines BL and /BL, and the second driving part 3b may include NMOS transistors N1 and N2 connected in series between the pair of bit lines BL and /BL.

If a voltage level of a first bit line BL is higher than a voltage level of a second bit line /BL, the first PMOS transistor P1 and the second NMOS transistor N2 may be turned-on and the second PMOS transistor P2 and the first NMOS transistor N1 may be turned-off. In this case, the voltage level of the first bit line BL may be amplified to a first power voltage level VDD, and the voltage level of the second bit line /BL may be amplified to a second power voltage level Vss.

On the contrary, if the voltage level of the second bit line /BL is higher than the voltage level of the first bit line BL, the first PMOS transistor P1 and the second NMOS transistor N2 may be turned-off and the second PMOS transistor P2 and the first NMOS transistor N1 may be turned-on. In this case, the voltage level of the second bit line /BL may be amplified to the first power voltage level VDD, and the voltage level of the first bit line BL may be amplified to the second power voltage level Vss.

When the sense amplifier 3 operates, a slight voltage difference between the bit lines BL and /BL should be sensed and amplified. To achieve this, the pair of PMOS transistors P1 and P2 should have the same electrical characteristic (e.g., the same threshold voltage), and the pair of NMOS transistors N1 and N2 should also have the same electrical characteristic (e.g., the same threshold voltage). To satisfy these demands, the MOS transistor described with reference to FIG. 1 or 3 may be applied to the NMOS and/or PMOS transistors of the sense amplifier 3.

Figure 13:
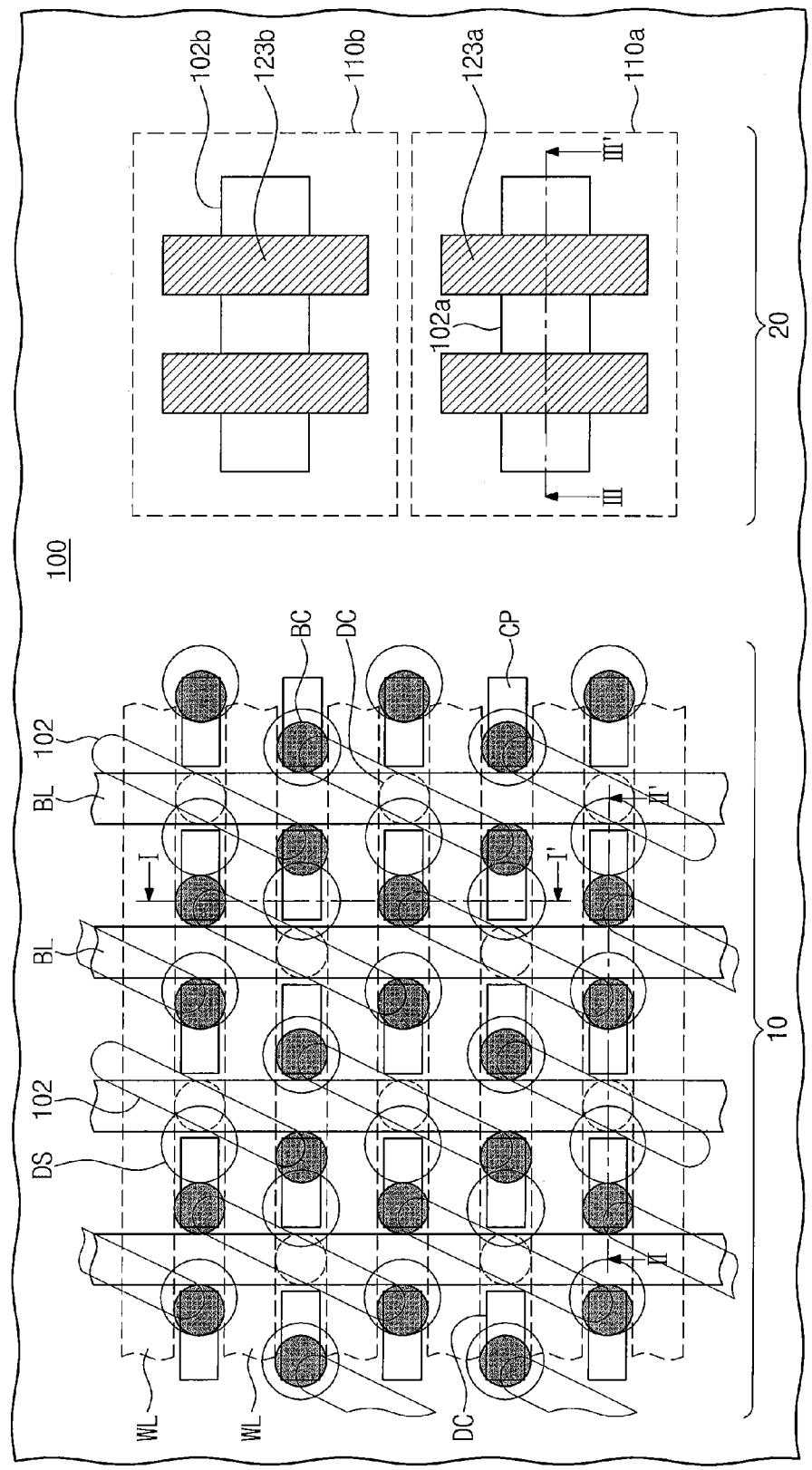
FIG. 13 is a plan view illustrating a semiconductor memory device according to an embodiment of the inventive concepts.
Figure 14:
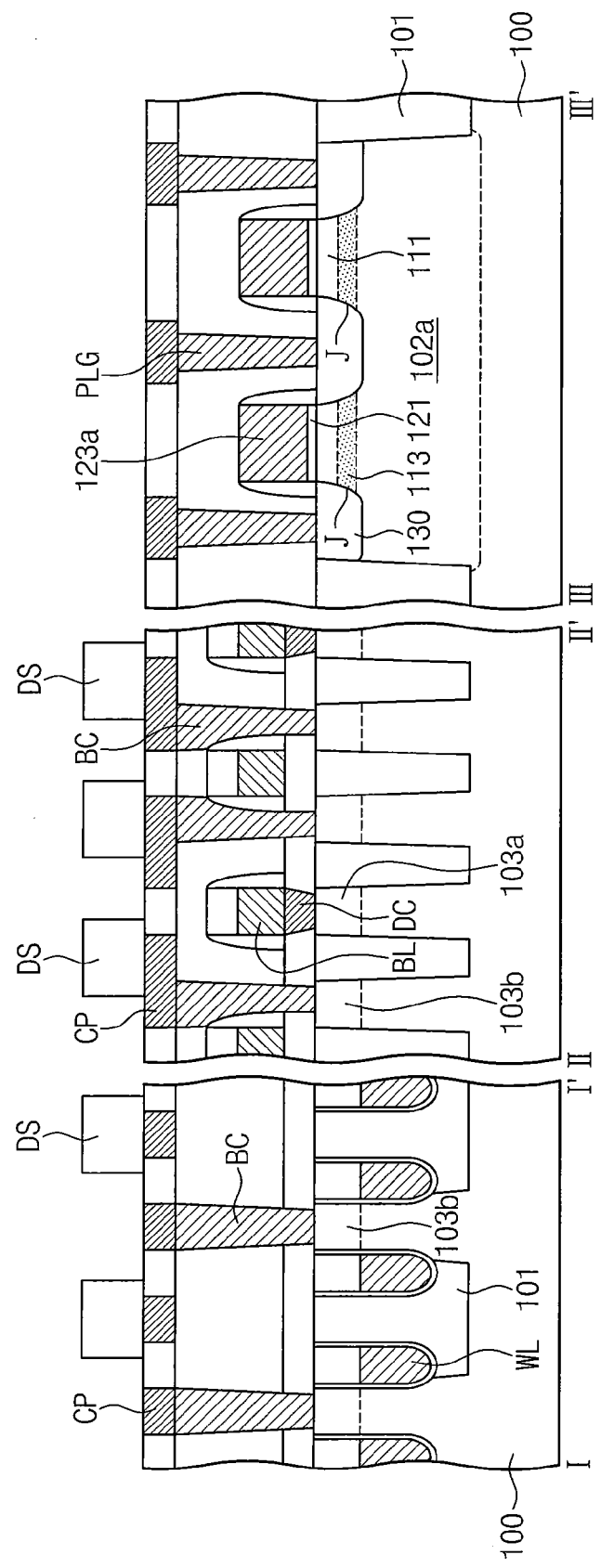
FIG. 14 is a cross-sectional view taken along lines I-I', II-II' and III-III' of FIG. 13 to illustrate a semiconductor memory device according to an embodiment of the inventive concepts.

FIG. 13 is a plan view illustrating a semiconductor memory device according to an embodiment of the inventive concepts. FIG. 14 is a cross-sectional view taken along lines I-I', II-II' and III-III' of FIG. 13 to illustrate a semiconductor memory device according to an embodiment of the inventive concepts.

Referring to FIGS. 13 and 14, a semiconductor substrate 100 may include a first region 10 and a second region 20 around the first region 10. In an embodiment, the first region 10 may be a cell array region and the second region 20 may be a peripheral circuit region.

According to embodiments, the memory cell array 1 of FIG. 11 including the plurality of memory cells MC of FIG. 11 may be disposed on the semiconductor substrate 100 of the first region 10. The memory cell array 1 may include the plurality of memory cells MC, a plurality of word lines WL, and a plurality of bit lines BL. The word lines WL and the bit lines BL may be electrically connected to the memory cells MC. In an embodiment, each of the memory cells MC may include a data storage element DS. For example, the data storage element DS may be a capacitor that includes a bottom electrode, a top electrode, and a dielectric layer disposed between the bottom and top electrodes. Alternatively, the data storage element DS may be a variable resistor that is switchable between two resistance states by an applied electrical pulse. For example, the variable resistor may include at least one magnetic material and/or may include a phase-change material of which a phase (or a crystal state) is changed according to a current amount. In still another embodiment, the data storage element DS may include a perovskite compound and/or a transition metal oxide.

A peripheral circuit may be disposed on the semiconductor substrate 100 of the second region 20. The peripheral circuit may include the row and column decoders 2 and 4 of FIG. 11, the sense amplifier 3 of FIG. 11, and a controller (not shown). In some embodiments, the peripheral circuit may include MOS transistors, at least one resistor and at least one capacitor which are electrically connected to the memory cell array 1.

According to some embodiments, a device isolation layer 101 may be formed in the semiconductor substrate 100 of the first region 10 to define cell active regions 102. Each of the cell active regions 102 may have a bar shape in a plan view, and a long axis of the cell active region 102 may be parallel to a direction diagonal to the word lines WL and the bit lines.

The word lines WL may intersect the cell active regions 102. In some embodiments, each of the word lines WL may be formed in a recess region that is recessed from a top surface of the semiconductor substrate 100 by a predetermined depth. A gate insulating layer may be disposed between the word line WL and an inner surface of the recess region. Top surfaces of the word lines WL may be lower than the top surface of the semiconductor substrate 100, and an insulating material may be in, and in some embodiments may fill, the recess regions having the word lines WL.

Cell source and drain regions 103a and 103b may be formed in the cell active regions 102 at both sides of each of the word lines WL. The cell source and drain regions 103a and 103b may be dopant regions doped with N-type or P-type dopants. The word lines WL and the cell source and drain regions 103a and 103b are formed as described above, so a plurality of MOS transistors may be formed on the semiconductor substrate 100.

The bit lines BL may be disposed on the semiconductor substrate 100 of the first region 10 to intersect the word lines WL. An interlayer insulating layer may be disposed between the semiconductor substrate 100 and the bit lines BL, and bit line contact plugs DC may penetrate the interlayer insulating layer so as to be connected to the cell source regions 103a. The bit lines BL may be electrically connected to the cell source regions 103a through the bit line contact plugs DC.

Buried contact plugs BC may be connected to the cell drain regions 103b. In addition, contact pads CP may be formed on the buried contact plugs BC, respectively. The contact pads CP may be two-dimensionally arranged on a second interlayer insulating layer of the first region 10. The contact pads CP may increase a contact area between the buried contact plug BC formed thereunder and the data storage element DS formed thereon. The data storage elements DS may be disposed on the contact pads CP, respectively.

In some embodiments, the semiconductor substrate 100 of the second region 20 may include a first well dopant layer 110a doped with dopants of a first conductivity type and a second well dopant layer 110b doped with dopants of a second conductivity type. In the second region 20, the device isolation layer 101 may define a first active region 102a and a second active region 102b in the first well dopant layer 110a and the second well dopant layer 110b, respectively.

According to an embodiment, the pair of NMOS transistors N1 and N2 of the sense amplifier 3 of FIG. 12 may be formed on the first well dopant layer 110a, and the pair of PMOS transistors P1 and P2 of the sense amplifier 3 of FIG. 12 may be formed on the second well dopant layer 110b. As described with reference to FIG. 12, the NMOS and PMOS transistors may be electrically connected to the bit lines BL of the first region 10.

In more detail, a pair of first gate electrodes 123a may be formed on the first active region 102a, and a pair of second gate electrodes 123b may be disposed on the second active region 102b.

As described above, the channel region 111 and the channel dopant layer 113 may be disposed under each of the first gate electrodes 123a. The channel dopant layer 113 may be formed by implanting dopant ions of the first conductivity type into the first well dopant layer 110a with a high dose. The channel dopant layer 113 may be spaced apart from the top surface of the semiconductor substrate 100 by a predetermined distance. Thus, the dopant concentration of the channel region 111 adjacent to the first gate electrode 123a may be lower than the dopant concentration of the channel dopant layer 113. In other words, it is possible to reduce variation of a threshold voltage of the MOS transistor which may be caused by dopants randomly diffused at the top surface of the semiconductor substrate 100.

In addition, the dopant diffusion barrier layer 112 may be formed between the channel region 111 and the channel dopant layer 113, as described with reference to FIG. 3. The dopant diffusion barrier layer 112 may include impurities such as carbon (C) and/or nitrogen (N). In addition, the dopant diffusion barrier layer 112 may further include germanium (Ge) causing lattice defects and/or lattice mismatch.

Since the heavily doped channel dopant layer 113 is formed to be spaced apart from the top surface of the semiconductor substrate 100 under each of the first gate electrodes 123a, it is possible to reduce a threshold voltage difference between the pair of transistors which may be caused by the random dopant fluctuation occurring at the surface of the semiconductor substrate 100. In other words, it is possible to reduce mismatch of the threshold voltages of the pair of NMOS transistors N1 and N2 of the sense amplifier 3 of FIG. 12.

Dopant of the second conductivity type may be ion-implanted into the first well dopant layer 110a to form first source/drain regions 130. The first source/drain regions 130 may be in contact with the channel dopant layer 113.

Gate spacers may be formed on the first source/drain regions 130 having a high concentration to cover both sidewalls of each of the first gate electrodes 123a. In addition, contact plugs PLG may be formed to be connected to the first source/drain regions 130, respectively.

Likewise, a channel region and a channel dopant layer may be disposed under each of the second gate electrodes 123b. The channel region and the channel dopant layer under the second gate electrode 123b may include dopants of the second conductivity type. In addition, second source/drain regions may be formed in the second well dopant layer 110b at both sides of each of the second gate electrodes 123b. The second source/drain regions may be doped with dopants of the first conductivity type.

Figure 15:
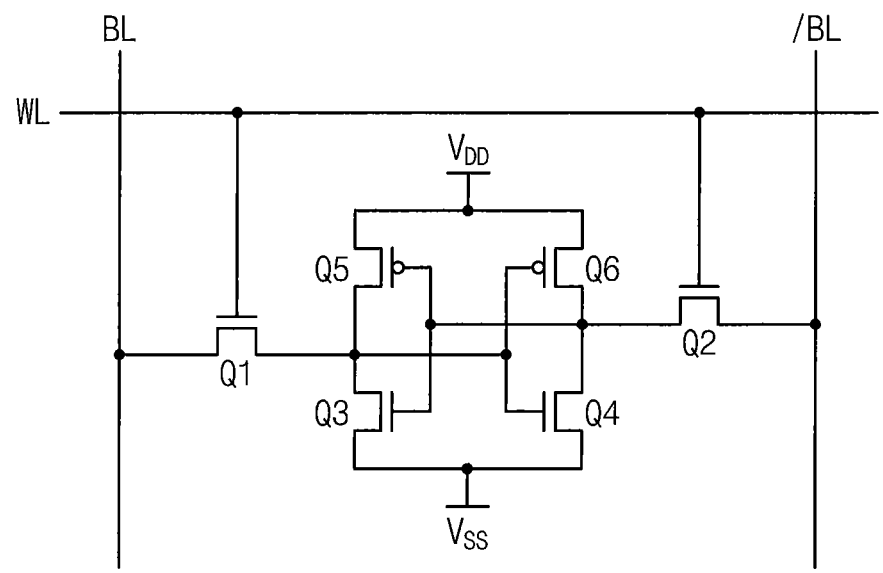
FIG. 15 is a circuit diagram illustrating a static random access memory (SRAM) device according to an embodiment of the inventive concepts.

FIG. 15 is a circuit diagram illustrating a static random access memory (SRAM) device according to an embodiment of the inventive concepts.

Referring to FIG. 15, one cell of a SRAM device may include first and second access transistors Q1 and Q2, first and second driver transistors Q3 and Q4, and first and second load transistors Q5 and Q6. Sources of the first and second driver transistors Q3 and Q4 may be connected to a ground line VSS, and sources of the first and second load transistors Q5 and Q6 may be connected to a power line VDD.

The first and second driver transistors Q3 and Q4 may correspond to NMOS transistors, and the first and second load transistors Q5 and Q6 may correspond to PMOS transistors. The first driver transistor Q3 and the first load transistor Q5 may constitute a first inverter, and the second driver transistor Q4 and the second load transistor Q6 may constitute a second inverter.

Output terminals of the first and second inverters may be connected to sources of the first and second access transistors Q1 and Q2, respectively. An input terminal of the first inverter may be connected to the output terminal of the second inverter, and the output terminal of the first inverter may be connected to an input terminal of the second inverter. Thus, the first and second inverters may constitute one latch circuit. Drains of the first and second access transistors Q1 and Q2 may be connected to first and second bit lines BL and /BL, respectively. The first and second access transistors Q1 and Q2 may correspond to NMOS transistors. The MOS transistor of FIG. 1 or 3 may be applied to the first and second driver transistors Q3 and Q4, the first and second load transistors Q5 and Q6, and/or the first and second access transistors Q1 and Q2.

Figure 16:
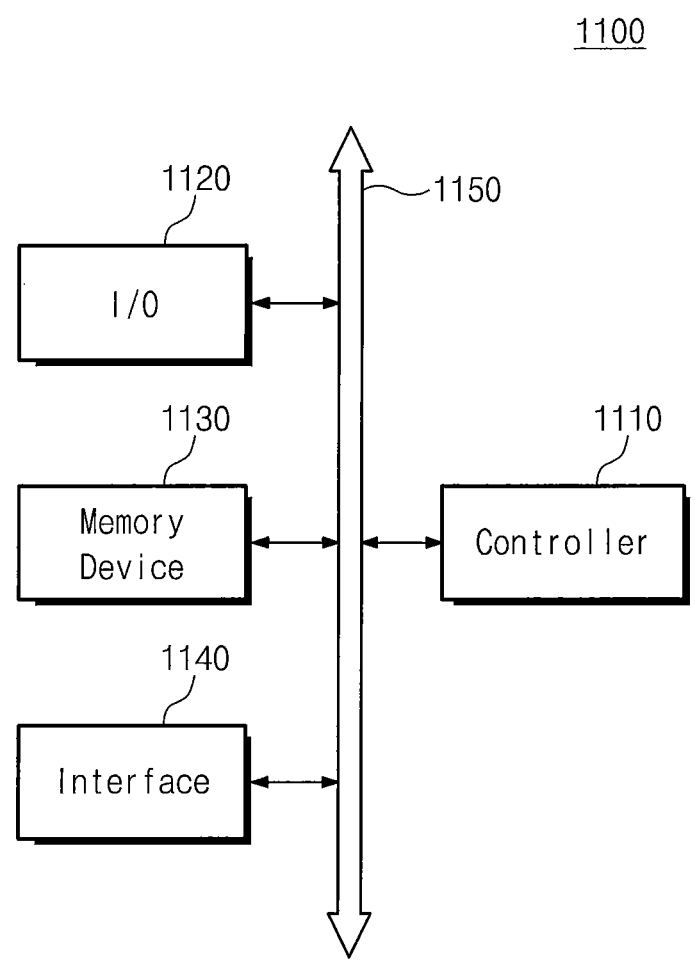
FIG. 16 is a schematic block diagram illustrating an electronic system including a semiconductor device according to embodiments of the inventive concepts.

FIG. 16 is a schematic block diagram illustrating an electronic system including a semiconductor device according to embodiments of the inventive concepts.

An electronic system including the semiconductor device according to the above embodiments of the inventive concepts may be applied to a personal digital assistant (PDA), a portable computer, a web tablet, a wireless phone, a mobile phone, a digital music player, a memory card, and/or other electronic products. The other electronic products may receive and/or transmit information/data by wireless and/or wired channels.

Referring to FIG. 16, an electronic system 1100 may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted. The controller 1110, the I/O unit 1120, the memory device 1130, and/or the interface unit 1140 may include at least one of the semiconductor devices according to the aforementioned embodiments of the inventive concepts.

The controller 1110 may include a microprocessor, a digital signal processor, a microcontroller and/or other logic devices having a similar function to any one thereof. The I/O unit 1120 may include a keypad, a keyboard and/or a display device.

The memory device 1130 may store data and/or commands. The interface unit 1140 may transmit electrical data to a communication network and/or may receive electrical data from a communication network.

The interface unit 1140 may operate by wireless and/or cable. For example, the interface unit 1140 may include an antenna for wireless communication and/or a transceiver for cable communication. Although not shown in the drawings, the electronic system 1100 may further include a fast dynamic random access memory (DRAM) device and/or a fast SRAM device which acts as a cache memory for improving an operation of the controller 1110.

According to embodiments of the inventive concepts, the channel dopant layer adjusting the threshold voltage of the MOS transistor is spaced apart from the top surface of the semiconductor substrate by a predetermined distance, so it is possible to reduce or minimize the variation of the threshold voltage which may be caused by the random dopant fluctuation of the dopants adjacent to the top surface of the semiconductor substrate. In addition, since the channel dopant layer may be heavily doped with the dopants of the first conductivity type, it is possible to reduce or prevent the channel length of the MOS transistor from being reduced by diffusion of the dopants of the source/drain regions having the second conductivity type.

Furthermore, it is possible to reduce the difference between the threshold voltages of the pair of MOS transistors which may be caused by dopants randomly diffused under the gate electrodes.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   a semiconductor substrate including a well dopant layer having a first conductivity type;
   a gate electrode on the well dopant layer;
   a channel dopant layer in the well dopant layer and spaced apart from a top surface of the semiconductor substrate, the channel dopant layer having the first conductivity type;
   a channel region between the gate electrode and the channel dopant layer, the channel region having the first conductivity type; and
   source/drain regions in the well dopant layer at both sides of the gate electrode, the source/drain regions having a second conductivity type,
   wherein a concentration of dopants having the first conductivity type in the channel dopant layer is higher than a concentration of dopants having the first conductivity type in the channel region,
   wherein each of the source/drain regions comprises: an upper portion adjacent to the channel region; and a lower portion adjacent to the channel dopant layer, and
   wherein a dopant concentration of the upper portion is substantially equal to a dopant concentration of the lower portion.

2. The semiconductor device of claim 1, further comprising:
   a gate spacer on both sidewalls of the gate electrode and extending on the source/drain regions.

3. The semiconductor device of claim 1, wherein a thickness of the channel dopant layer is greater than a thickness of the channel region.

4. The semiconductor device of claim 1, wherein the channel region and the channel dopant layer have the same crystal structure.

5. The semiconductor device of claim 1, wherein a distance from the top surface of the semiconductor substrate to the channel dopant layer is smaller than a width of the gate electrode.

6. The semiconductor device of claim 1, wherein a distance from the top surface of the semiconductor substrate to the channel dopant layer is in a range of about 50 nm to about 80 nm.

7. The semiconductor device of claim 1, wherein the concentration of the dopants having the first conductivity type in the channel dopant layer is in a range of about $1 \times 10^{17}$ atom/cm$^3$ to about $1 \times 10^{18}$ atom/cm$^3$.

8. The semiconductor device of claim 1, wherein the concentration of the dopants having the first conductivity type in the channel region is in a range of about $1 \times 10^{16}$ atom/cm$^3$ to about $1 \times 10^{17}$ atom/cm$^3$.

9. The semiconductor device of claim 1, further comprising:
   a dopant diffusion barrier layer between the channel dopant layer and the channel region,
   wherein the dopant diffusion barrier layer includes carbon (C), and
   wherein a crystal structure of the dopant diffusion barrier layer is different from a crystal structure of the channel dopant layer.

10. A semiconductor device comprising:
    a plurality of memory cells, a respective one of which is connected to a respective crossing point of word lines and bit line crossing the word lines; and a sense amplifier connected to at least one of the bit lines to sense data stored in the memory cells,
wherein the sense amplifier comprises a pair of MOS transistors,
wherein the pair of MOS transistors comprises:
 a well dopant layer in a semiconductor substrate and having a first conductivity type;
 gate electrodes spaced apart from each other on the well dopant layer;
 source/drain regions in the well dopant layer at both sides of each of the gate electrodes, the source/drain regions having a second conductivity type;
 a channel dopant layer under each of the gate electrodes, the channel dopant layer having the first conductivity type; and
 a channel region between the channel dopant layer and each of the gate electrodes, the channel region having the first conductivity type,
wherein a concentration of dopants having the first conductivity type in the channel dopant layer is higher than a concentration of dopants having the first conductivity type in the channel region.

11. The semiconductor device of claim 10, further comprising:
 a dopant diffusion barrier layer between the channel dopant layer and the channel region, the dopant diffusion barrier layer including carbon (C).

12. The semiconductor device of claim 10, further comprising:
 a gate spacer on both sidewalls of each of the gate electrodes and extending on the source/drain regions.

13. The semiconductor device of claim 10, wherein each of the source/drain regions comprises: an upper portion adjacent to the channel region; and a lower portion adjacent to the channel dopant layer, and
 wherein a dopant concentration of the upper portion is substantially equal to a dopant concentration of the lower portion.

14. The semiconductor device of claim 10, wherein a distance from a top surface of the semiconductor substrate to the channel dopant layer is smaller than a width of each of the gate electrodes.

15. The semiconductor device of claim 10, wherein a thickness of the channel dopant layer is greater than a thickness of the channel region.

16. A semiconductor device comprising:
 a substrate;
 a gate electrode on a face of the substrate;
 a buried region having a first conductivity type in the substrate, beneath and spaced apart from the gate electrode, the buried region having a higher dopant concentration of the first conductivity type than the substrate between the buried region and the gate electrode and than the substrate beneath the buried region remote from the gate electrode; and
 a source/drain region having a second conductivity type in the substrate that provides a P-N junction with the buried region, with the substrate between the buried region and the gate electrode and with the substrate beneath the buried region remote from the gate electrode, the source/drain region having substantially the same concentration of dopants of the second conductivity type at the P-N junction and remote from the p-n junction.

17. The semiconductor device of claim 16 wherein the buried region is thicker than the substrate between the buried region and the gate electrode.

18. The semiconductor device of claim 16 wherein the gate electrode is wider than a thickness of the substrate between the buried region and the gate electrode.

19. The semiconductor device of claim 16 further comprising:
 a dopant diffusion barrier layer comprising carbon (C), between the buried region and the gate electrode.

20. The semiconductor device of claim 16 further comprising a sense amplifier comprising a plurality of transistors, at least one of which comprises the gate electrode, the buried region and the source/drain region.

* * * * *